United States Patent [19]

Itakura et al.

[11] Patent Number: 5,264,656
[45] Date of Patent: Nov. 23, 1993

[54] ELECTRONIC SOUND GENERATING DEVICE

[75] Inventors: Tadayuki Itakura; Mutsumi Aruga; Makoto Orii; Masaki Yamamoto; Shigeyoshi Takagi, all of Nagano, Japan

[73] Assignee: Kabushiki Kaisha Sankyo Seiki Seisakusho, Nagano, Japan

[21] Appl. No.: 662,522

[22] Filed: Feb. 28, 1991

[30] Foreign Application Priority Data

Mar. 5, 1990 [JP] Japan ............................ 2-21471[U]
Mar. 5, 1990 [JP] Japan ............................ 2-51685
Mar. 9, 1990 [JP] Japan ............................ 2-58528

[51] Int. Cl.$^5$ ............................ H05K 1/16; G10F 1/00
[52] U.S. Cl. ............................ 84/600; 381/116; 84/644; 84/743; 84/94.2; 29/849
[58] Field of Search ............ 381/111, 116, 190, 191, 381/69.2; 340/384 E; 84/600, 644, 670, 718, 743, 94.1–95.2; 29/846, 849, 609.1; 361/421

[56] References Cited

U.S. PATENT DOCUMENTS

| | | | |
|---|---|---|---|
| 4,400,861 | 8/1983 | Parker | 29/609.1 X |
| 4,403,107 | 9/1983 | Hoffman | 29/849 X |
| 4,434,567 | 3/1984 | Le Veau | 84/94.2 |
| 4,524,247 | 6/1985 | Lindenberger et al. | 381/111 X |
| 4,554,613 | 11/1985 | Kaufman | 74/52.2 X |
| 4,627,736 | 12/1986 | Komaki | 368/88 |
| 4,710,961 | 12/1987 | Buttner | 381/69.2 X |
| 4,870,688 | 9/1989 | Voroba et al. | 381/69.2 X |
| 4,922,540 | 5/1990 | Erbe | 381/69.2 X |

FOREIGN PATENT DOCUMENTS

| | | | |
|---|---|---|---|
| 2830801 | 1/1979 | Fed. Rep. of Germany | 29/609.1 |
| 2315818 | 1/1977 | France | 29/609.1 |
| 55-141896 | 11/1980 | Japan | 29/609.1 |
| 59-152535 | 10/1984 | Japan | |

*Primary Examiner*—William M. Shoop, Jr.
*Assistant Examiner*—Brian Sircus
*Attorney, Agent, or Firm*—Sughrue, Mion, Zinn, Macpeak & Seas

[57] ABSTRACT

A device for electronically generating a sound according to the present invention includes an integrated circuit chip producing electronic signals corresponding to a desired melody, a switch controlling the ON and OFF states of the integrated circuit chip, a battery powering the integrated circuit chip, a sound generator having a dish-shaped vibrating plate and producing sounds responsive to the electronic signals, and a circuit pattern section having a plurality of lead portions interconnecting the integrated circuit chip, the switch, the battery and the sound generator. The circuit pattern section is formed by punching a conductive metal sheet in a press. Selected ones of the lead portions can advantageously be formed by punching into the battery holder or the switch. According to one aspect of the invention, an acoustic chamber is defined by the sound generator and a cover formed by potting or injection molding. According to another aspect of the invention, a resin seal is formed over the integrated circuit chip. A method for forming the electronic sound generating device is also described.

18 Claims, 9 Drawing Sheets

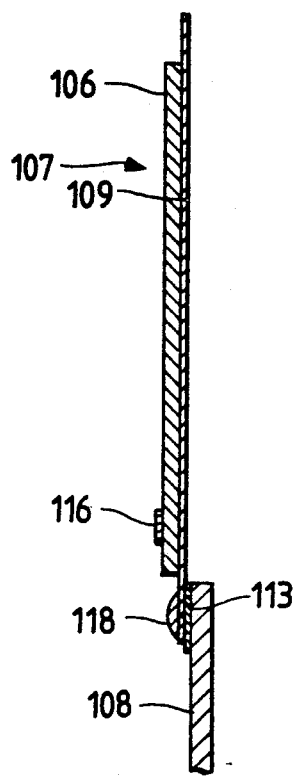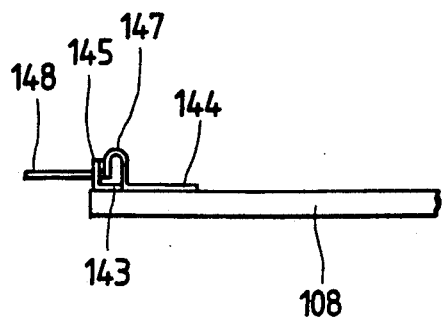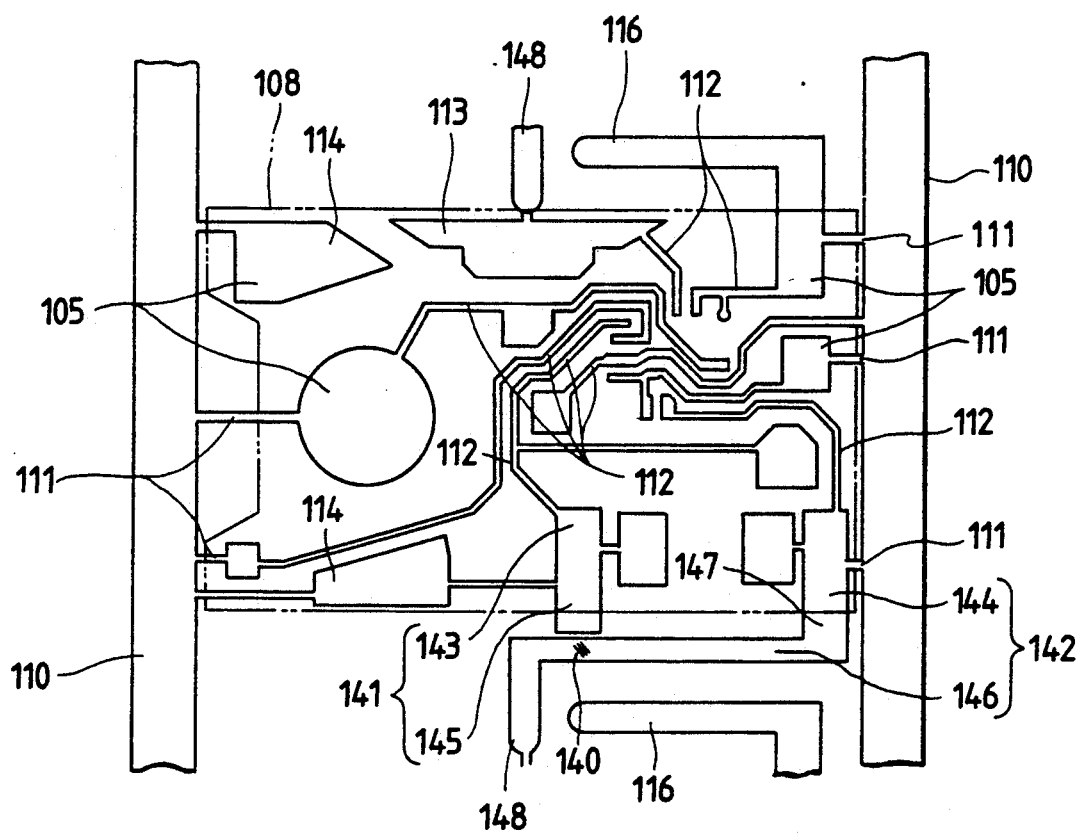

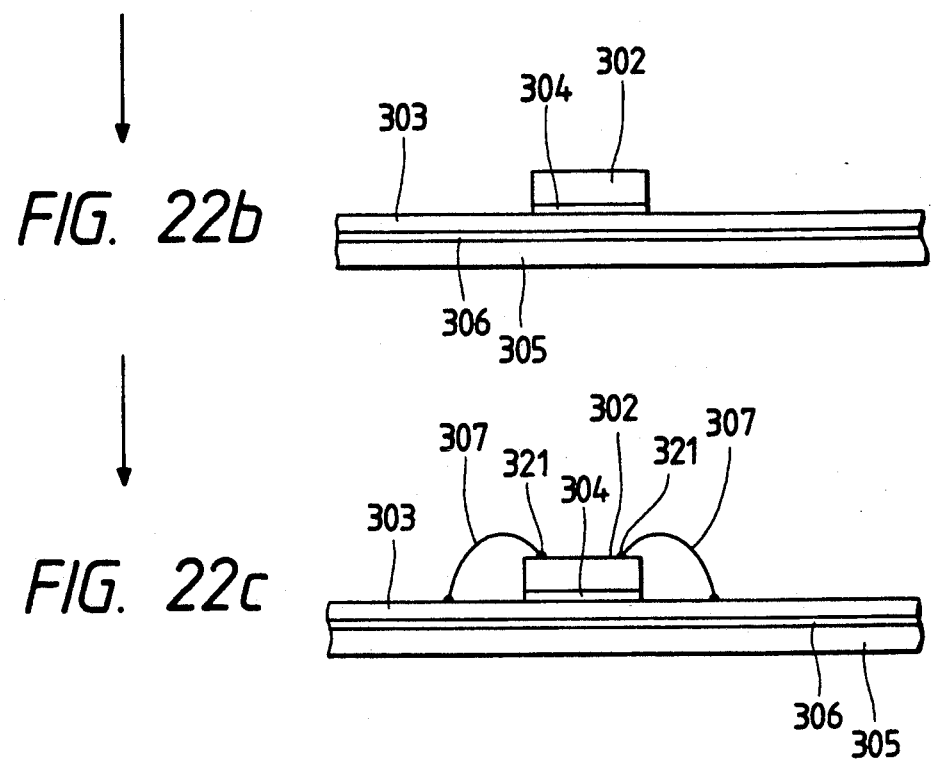
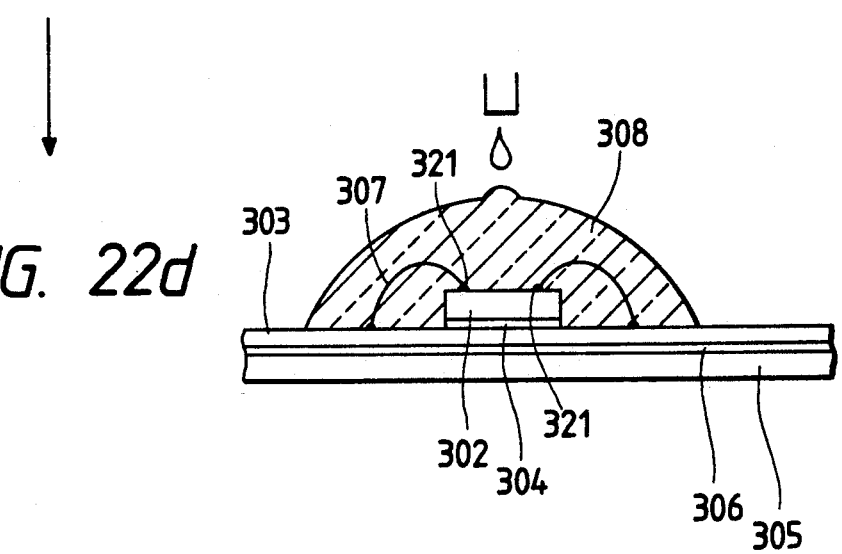

ELECTRONIC SOUND GENERATING DEVICE

FIELD OF THE INVENTION

The present invention relates generally to an electronic device for generating an audible tone. More specifically, the present invention relates to an electronic sound generating device suitable for use in an electronic music box.

BACKGROUND OF THE INVENTION

An electronic sound generating device suitable for use in applications such as electronic music boxes is known and includes both an electronic circuit and a sound generator shaped from a thin plate. The conventional electronic circuit includes a circuit element such as an integrated circuit chip for producing electrical signals corresponding to the desired sounds, a battery, a switch and a printed circuit board on which the circuit element, the battery and the switch are mounted.

Generally, specialized technology and equipment are necessary to manufacture the printed circuit board, which makes the printed circuit board expensive. In many cases, it is necessary to subcontract the printed circuit board production to a specialty house, which can increase the manufacturing costs of the printed circuit board even more. It is also necessary to mount the battery holder on the printed circuit board and to attach the sound generator during assembly of the conventional electronic sound generating device. It will be apparent that a large number of manufacturing steps are necessary during the assembly process. In addition, since the components used in manufacturing the conventional electronic sound generating device are each manufactured separately, the number of individual components is large, requiring complicated and expensive inventory management.

SUMMARY OF THE INVENTION

The principal object of the present invention is to provide an electronic sound generating device at a lower cost than that of conventional sound generating devices. Accordingly, a circuit pattern section replaces a conventional printed circuit board in the present invention to thereby lower the cost of the electronic sound generating device.

Another object of the present invention to provide an electronic sound generating device at a lower cost in which a circuit pattern section replaces necessary functional members of an electronic circuit to thereby reduce the number of components as well as the number of manufacturing steps needed to provide the electronic sound generating device.

Still another object of the present invention is to provide an improved electronic sound generating device having increased rigidity and stability at a cost lower than that of conventional sound generating devices. A reinforcing plate of the electronic sound generating device according to the present invention includes a reinforcing plate which advantageously provides a sound generator producing acoustic amplification which is simple in construction.

Another object of the present invention is to provide an improved electronic sound generating device wherein a circuit element on a circuit pattern section is sealed in a simple manner.

These and other objects, features and advantages are achieved in accordance with the present invention by an electronic sound generating device comprising an integrated circuit chip for producing electronic signals corresponding to a desired melody; a switch means for controlling the ON and OFF states of the integrated circuit chip; a battery operatively coupled to the integrated circuit chip; a sound generator having a dish-shaped vibrating plate for producing sounds responsive to the electronic signals; and a circuit pattern section having a plurality of lead portions for interconnecting the integrated circuit chip, the switch means, the battery and the sound generator, the circuit pattern section being formed from an electroconductive metal sheet and being fitted with and supporting the integrated circuit chip and the battery.

According to a first preferred embodiment of the present invention, the circuit element, the battery, and the switch are electrically coupled to each other by the circuit pattern section made from the electroconductive metal sheet, and form a circuit necessary for generating an electronic signal corresponding to a desired melody. According to one aspect of the present invention, either the battery holder or the switch is fabricated from the electroconductive metal sheet simultaneously with the fabrication of the circuit pattern section. It will be apparent that, since a plurality of battery contact portions comprising the battery holder and the switch contact portions are manufactured integrally and simultaneously with the circuit pattern section, separate manufacturing steps for producing and mounting the battery holder and the switch contact portions are not required in the present invention. Therefore, the number of components as well as the number of manufacturing steps for the device are diminished.

According to another aspect of the present invention, a portion of the reinforcing plate comprises a cover for the sound generator so that a improved acoustic amplification is produced and the circuit pattern section is reinforced by the plate. It will be appreciated that, since a vibrating plate of the sound generator includes a recess and notch, an acoustic chamber is easily formed to provide improved acoustic amplification, even when the sound generator is not provided opposing an adjacent surface such as a cap.

In another preferred embodiment of the present invention, the circuit element is coated with the resin so that the circuit element is provided with a seal but wherein molding dies are not required. It will be apparent that a heat-resistant sheet operatively connected to the bottom of the circuit pattern section advantageously prevents the molten resin forming the seal from migrating through the circuit pattern section. Therefore, the circuit element is securely sealed.

These and other objects, features and advantages of the invention are disclosed in or apparent from the following description of preferred embodiments.

BRIEF DESCRIPTION OF THE DRAWINGS

The preferred embodiments are described with reference to the drawings, in which like elements are denoted by similar numbers, and in which:

FIG. 7 is a sectional view of the electrically coupled part of the device shown in FIG. 6;

FIG. 8 is a sectional view of the switch portion of the device shown in FIG. 6;

FIG. 9 is a plan view of the circuit pattern section used in forming the electronic sound generating device shown in FIG. 6;

FIGS. 22a through 22d are explanatory sectional views of the steps of the method for producing the electronic sound generating device shown in FIG. 20.

DESCRIPTION OF THE PREFERRED EMBODIMENTS

Figure 1:
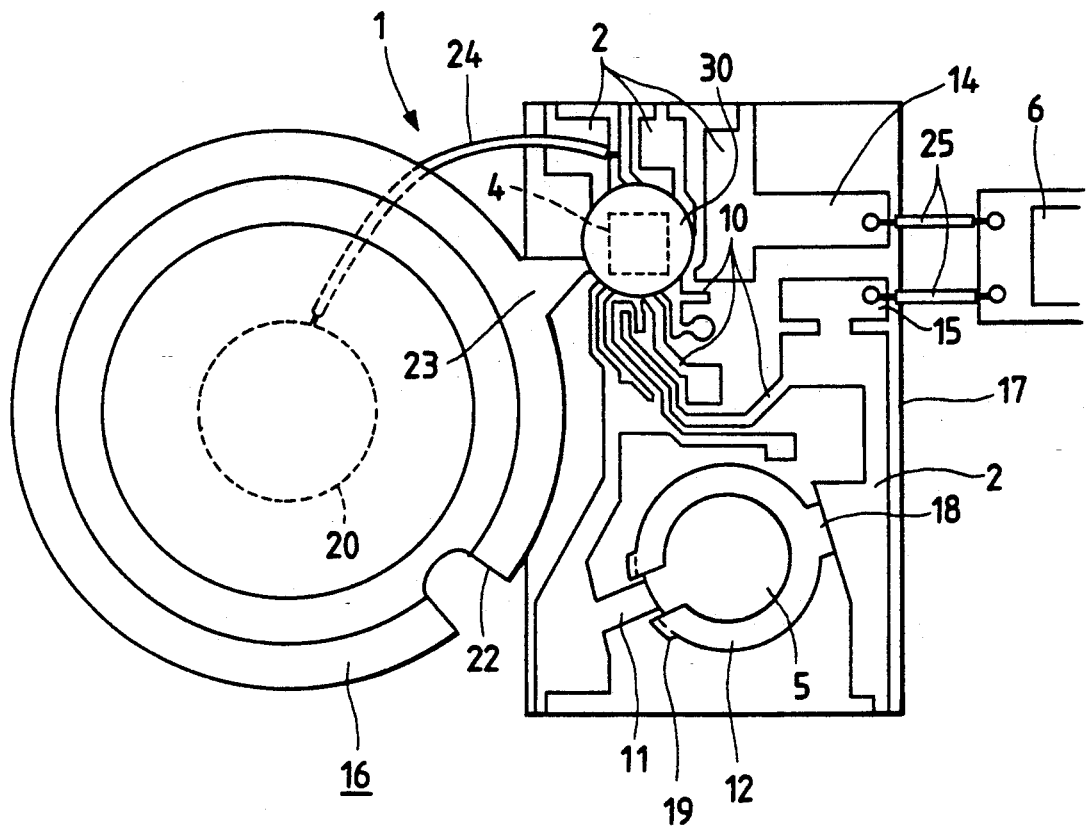
FIG. 1 is a plan view of an electronic sound generating device according to a first embodiment of the present invention.

A first preferred embodiment and advantageous modifications thereof according to the present invention are described while referring to FIGS. 1-5. In FIGS. 1-4, an electronic sound generating device 1 comprises a circuit pattern section 2 and a sound generator 3. A circuit element 4, a compact battery 5 and a switch 6 advantageously are attached to circuit pattern section 2. Preferably, element 4, battery 5, switch 6 and section 2 cooperate to produce an electric signal corresponding to a desired melody which is applied to sound generator 3 to produce the desired melody. Preferably, switch 6 is a pressure sensitive switch so that electrical signals corresponding to the desired melody are only produced while the switch 6 is closed by applied pressure. It will be noted that FIG. 1 illustrates a fully assembled electronic sound generating device 1.

Figure 4:
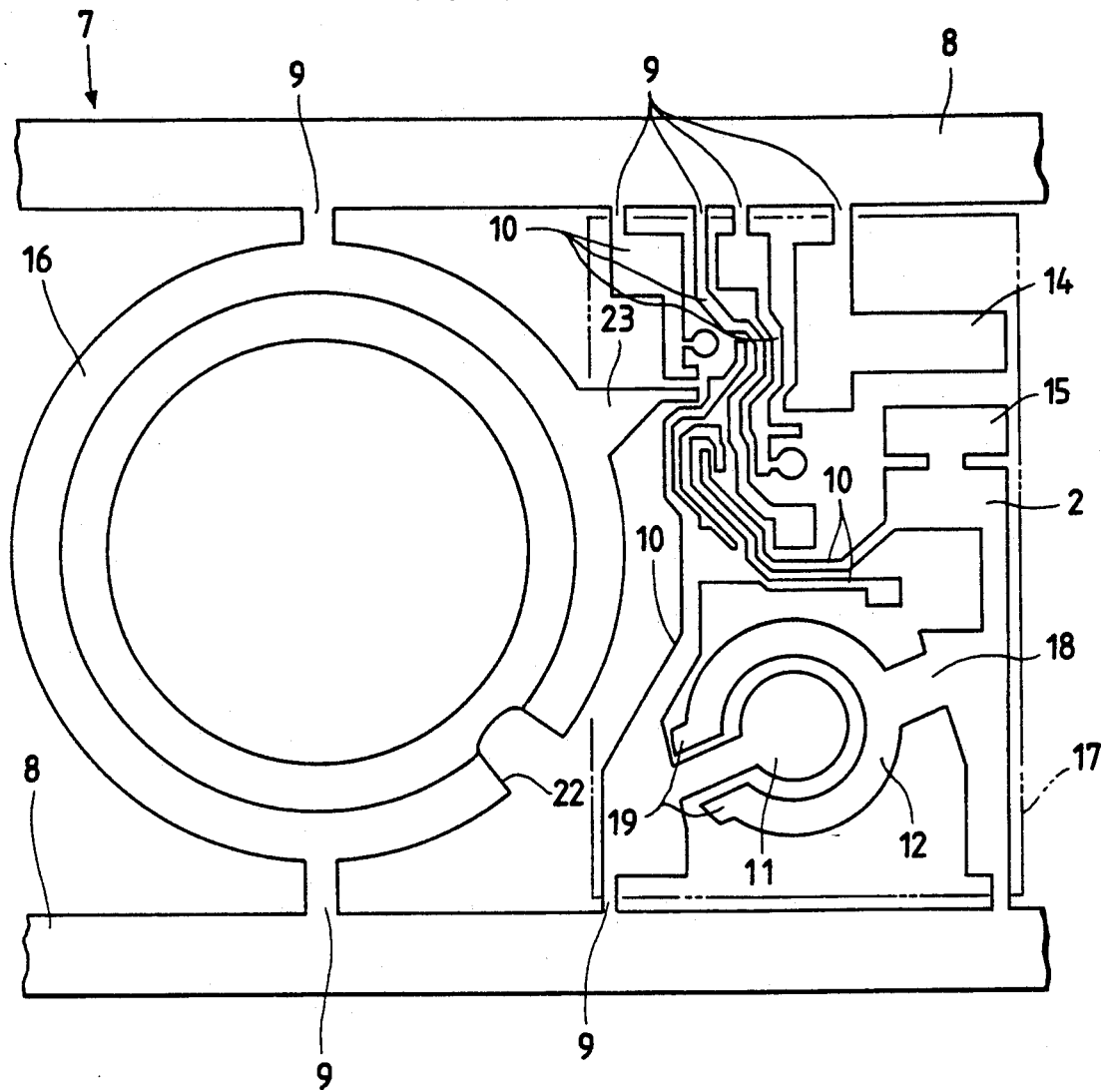
FIG. 4 is a plan view of a punched electroconductive metal sheet forming the circuit pattern section of the electronic sound generating device of FIG. 1.

As shown in FIG. 4, a circuit pattern section 2 is made from a band-like electroconductive metal sheet 7 by punching with a conventional press. Immediately after the punching operation, the section 2 includes continuously extended portions 8 corresponding to the side edges of the original sheet 7, which are connected by a plurality of coupling portions 9 to circuit pattern section 2. It will be appreciated that the circuit pattern section 2 formed as described above is a novel feature of the present invention.

After all the individual components, for example, the circuit element 4, which preferably is an integral circuit chip, are mounted on a corresponding circuit pattern section 2, the coupling portions 9 are cut off so that the section 2 is severed from the continuously extending portions 8. Preferably, section 2 is secured to the surface of an electrically-insulating reinforcing plate 17 by an adhesive.

It will be apparent from FIGS. 1 and 4 that section 2 is integrally formed with a plurality of lead portions 10, a battery holder 13 comprising a pair of battery contact portions 11 and 12, and a pair of switch terminals 14 and 15 at the time of punching. It will also be apparent from FIG. 4 that a vibrating plate 16, which is used to produce sound generator 3, advantageously is also produced during the punching operation.

Figure 3:
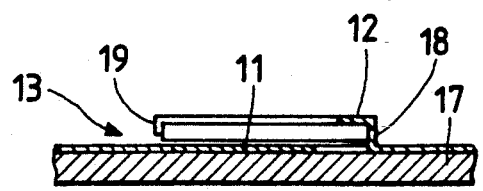
FIG. 3 is a sectional view of the battery holder of the electronic sound generating device of FIG. 1.

A first battery contact portion 11 advantageously is circularly shaped, while a second battery contact portion 12 is C-shaped and located so as to substantially surround battery contact portion 11. Preferably, both battery contact portions 11 and 12 are each connected to one of the lead portions 10. Battery contact portion 12 advantageously can be integrally formed with stoppers 19 at the ends of battery contact portion 12 to increase the holding capacity of battery contact portion 12. Preferably, the lead portion 10 connected to battery contact portion 12 is connected via a bent portion 18, which is bent as shown in FIG. 3 so that the battery contact portion 12 is substantially parallel to and opposing battery contact portion 11. It will be appreciated that portions 11 and 12 are separated by a predetermined distance less than or equal to the thickness of battery 5. The compact battery 5 advantageously is pinched between the battery contact portions 11 and 12 so that the battery is held by the battery holder 13 composed of the battery contact portions 11 and 12.

Figure 2:
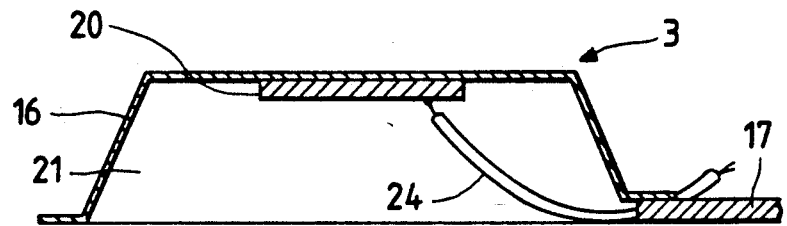
FIG. 2 is a sectional view of the sound generator of the electronic sound generating device of FIG. 1.
Figure 5:
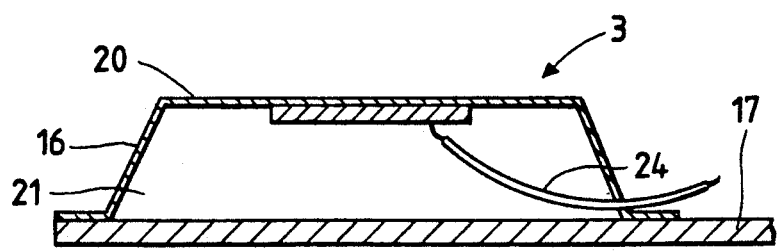
FIG. 5 is a sectional view of a modified sound generator for the electronic sound generating device of FIG. 1.

As shown in FIGS. 1-5, sound generator 3 comprises the vibrating plate 16 and an electrostrictive member 20. During the punching operation of the metal sheet 7, the vibrating plate 16 is pressed to form a dish-shaped element, which further includes a recess 21 inside the peripheral portion of plate 16, a sound release notch 22 and an electroconductive coupling part 23. Preferably, both the notch 22 and the coupling part 23 are located in the peripheral portion of vibrating plate 16. The electrostrictive member 20 advantageously is mounted in the center of the recess 21 by a conventional attaching process, such as gluing. As shown in FIGS. 2 and 5, member 20 is advantageously connected to one of the lead portions 10 through a lead wire 24. The edge of vibrating plate 16 is attached to the edge of reinforcing plate 17 by conventional techniques, for example by rivets or solder. It will be noted that the peripheral edge of the vibrating plate 16 is on approximately the same plane as the bottom of the reinforcing plate 17. Preferably, when the electronic sound generating device 1 is installed during final assembly of, for example, a music box, an acoustic chamber is formed by recess 21 and an adjacent surface, for example, the adjacent surface of reinforcing plate 17. This arrangement is illustrated in FIG. 5. It will be apparent the acoustic chamber heightens the sound generating effect of sound generator 3.

The switch 6 advantageously is attached by a pair of lead wires 25 to the corresponding switch terminals 14 and 15 by soldering. The circuit element 4 advantageously is connected to the lead portions 10 of the circuit pattern section 2 by wire bonding. Preferably, the connections between element 4 and the lead portions 10 are protected by a coating portion 30.

It will be appreciated that, while the vibrating plate 16 is illustrated as pressed into a dish-shaped element, it is not limited to this configuration. Vibrating plate 16 advantageously can be a flat plate. It will also be apparent that while plate 16 is illustrated as a monolithic plate, it is not confined thereto but can be made of a plurality of separate pieces secured to one another by conventional attaching techniques such as by soldering. As described above, the reinforcing plate 17 advantageously can disposed to close the recess of the vibrating plate 16, as shown in FIG. 5, so that the device 1 is not affected by the quality or form of the installation surface of an object, for example, a music box, in which the electronic sound generating device 1 is to be installed.

As discussed above, the circuit pattern section 2 of electronic sound generating device 1 is made from an electroconductive metal sheet. It will be apparent that a printed circuit board is not needed in the electronic sound generating device. It will also be apparent that the circuit pattern section is easier to manufacture and less expensive that a printed circuit board. It will also be noted that, since the circuit pattern section advantageously includes a pair of battery contact portions, which advantageously are made from the electroconductive metal sheet integrally with the circuit pattern section and bent to constitute a battery holder, a separate battery holder does not need to be manufactured and soldered to the circuit pattern section. Therefore, the number of components of the electronic sound generating device is reduced, the manufacturing of the device is simplified, and the overall cost of the device is reduced.

Other preferred embodiments of the present invention are similar in construction and operation to the first preferred embodiment of the present invention, and the other preferred embodiments will only be described in sufficient detail to illustrate the novel features of each of the additional preferred embodiments.

Figure 6:
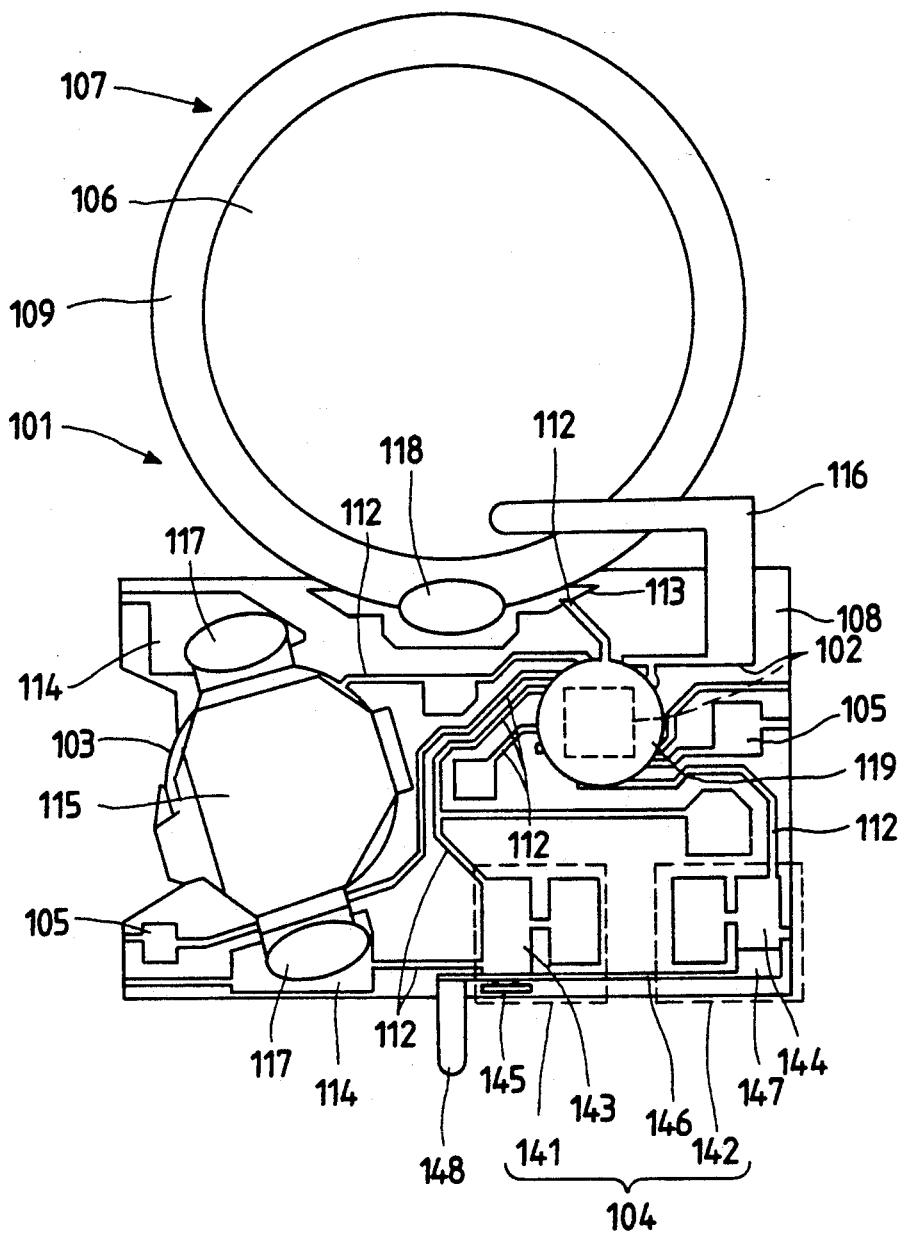
FIG. 6 is a plan view of an electronic sound generating device according to a second embodiment of the present invention.

A second preferred embodiment, and advantageous modifications, of the present invention are described below while referring to FIGS. 6 through 14. In FIG. 6, an electronic sound generating device 101 comprises a circuit pattern section 105, which is made from an electroconductive metal sheet and is fitted with a circuit element 102, a button-like compact battery 103 and a leaf-like switch 104, which cooperate to generate electric signals corresponding to a desired melody and output to a sound generator 107. Sound generator 107 comprises an electrostrictive member 106 secured to a thin electroconductive vibrating metal plate 109.

The circuit pattern section 105 is made from the metal sheet in the same manner as described with respect to the first preferred embodiment and is secured to a reinforcing plate 108. A plurality of electroconductive lead portions 112 are integrally formed in the circuit pattern section 105. Lead portions 112 advantageously are located at positions corresponding to the positions for attaching the leads of the circuit element 102. Preferably, lead portions 112 also interconnect a mounting portion 113 for mounting the sound generator 107, two securing portions 114 for securing a battery holder 115, a pair of switch contact portions 141 and 142 for switch 104, and a lead portion 116 for energizing member 106.

As shown in FIG. 6, battery 103 is removably held in a predetermined position on circuit pattern section 105 by the electroconductive holder 115, which preferably is attached to the securing portions 114 by soldering 117, is electrically coupled to the electroconductive portions 112 for powering circuit element 102.

Figure 10:
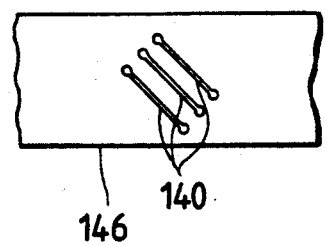
FIG. 10 is an enlarged plan view of the switch contact portion of the electronic sound generating device shown in FIG. 6.
Figure 11:
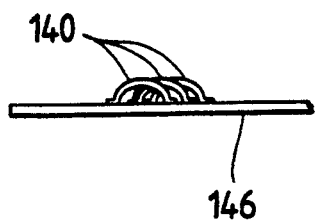
FIG. 11 is an enlarged sectional view of the switch contact portion shown in FIG. 10.
Figure 12:
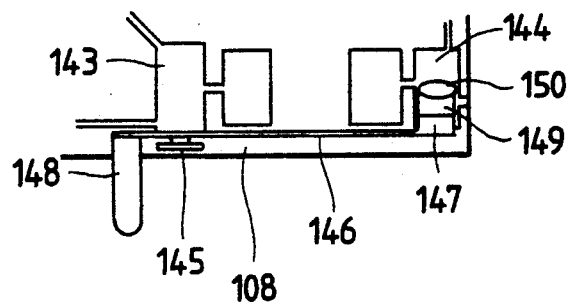
FIGS. 12 and 13 are plan views of modified switch portions of the electronic sound generating device shown in FIG. 6.

One of the novel features of this preferred embodiment of the present invention is that switch 104 is formed from the pair of switch contact portions 141 and 142 provided in circuit pattern section 105. Thus, a switch means comprises fixed parts 143, 144 and moving parts 145 and 146. The fixed part 143 of the switch contact portion 141 advantageously is connected to an electroconductive portion 112 of circuit pattern section 105. Preferably, the switch contact portion 141 is bent into an L-shaped piece so that the moving part 145 of the portion 143 is formed. The fixed part 144 of the other switch contact portion 142 is connected to another electroconductive portion 112 of section 105, which is attached to the reinforcing plate 108, and is bent into an U-shaped piece at one end of part 144 so that the part extends to a slender moving part 148 via an elastic part 147. As shown in FIGS. 10 and 11, the moving part 146 has one or more switch contacts 140 made of electroconductive wires, which are located so as to face the opposing moving part 145. The switch contacts 140 are attached to the circuit pattern section 105 during the wire bonding operation of circuit element 102 to circuit pattern section 105. The contacts 140 of high reliability elements which advantageously can be manufactured in a simple manner, thus making it unnecessary to provide separate noble metal contacts.

The vibrating plate 109 of the sound generator 107 is a thin metal plate having electrostrictive member 106 connected. e.g., glued, to the central portion of one side of the plate 109 and mechanically secured to the mounting portion 113 of the circuit pattern section 105 by soldering 118. The sound generator 107 is electrically connected to the circuit element 102 through one lead portion 112. The electrostrictive member 106 advantageously is always in contact with the tip of a lead portion 116 of the circuit pattern section 105 and electrically coupled to a predetermined portion of section 105 through a lead portion 112. Preferably, lead portion 116 is flexible so that the tip of lead portion 116 and the electrostrictive member 106 are continually in contact with each other.

It will be apparent that, while both the switch contact portions 141 and 142 of the switch 104 are portions of the circuit pattern section 105, the embodiment is not limited to this configuration. Switch 104 can be modified so that a switch contact portion 141 is integrally formed in circuit pattern section 105 and secured and electrically coupled at a fixed part 149 to the fixed part 144 of the section by soldering 150 or the like. It will be appreciated that, since soldering is not required for switch contact portion 141 in the modification, the number of soldered portions is reduced, thereby reducing the manufacturing cost of the device 102.

Figure 14:
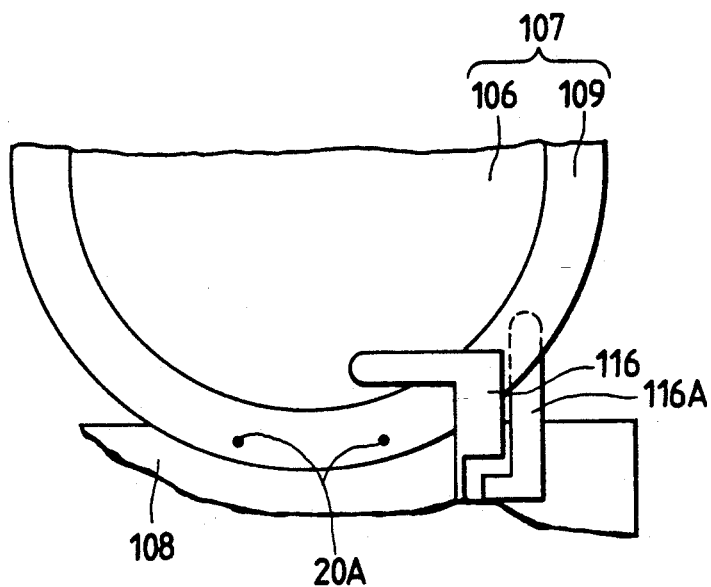
FIG. 14 is a plan view of modified lead portions of the electronic sound generating device of FIG. 6.

It will also be apparent that, since the vibrating plate 109 is directly attached to the circuit pattern section 105, only lead portion 116 is required to connect the electrostrictive member 106 to the section 105. It will be noted that, if vibrating plate 109 is attached to the reinforcing plate 108, both lead portion 116 and another lead portion are required for connecting the vibrating plate 109 to the circuit pattern section 105. A second lead portion 116 advantageously can be integrally formed in section 105 and always kept in pressure contact with the vibrating plate, as shown in FIG. 14. In the latter case, the sound generator 107 is secured to the reinforcing plate by a plurality of rivets 20A.

Figure 13:
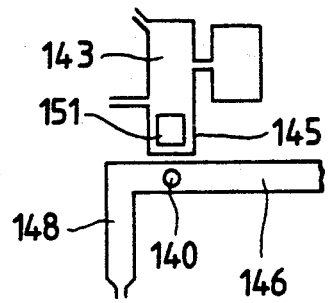

It will also be noted that while the switch contacts 140 can be made of electroconductive wires, the embodiment is not limited to that configuration. Switch contacts 140 can be modified so that the switch contacts 140 are formed by projections during press embossment of the electroconductive metal sheet, as shown in FIG. 13. The reliability of the projections, even without noble metal plating, advantageously is high.

Preferably, at least one of the switch contact portions of a leaf-like switch 104 is integrally formed by a part of circuit pattern section 105 during the pressing operation. Other parts of the switch contact portions advantageously need not be soldered, so that the device 101 is both simple to assemble and relatively inexpensive. If the switch contact portions are integrally formed along with the other parts of the circuit pattern section 105 during the pressing operation, the switch does not need to be manufactured separately from the circuit pattern section.

Figure 15:
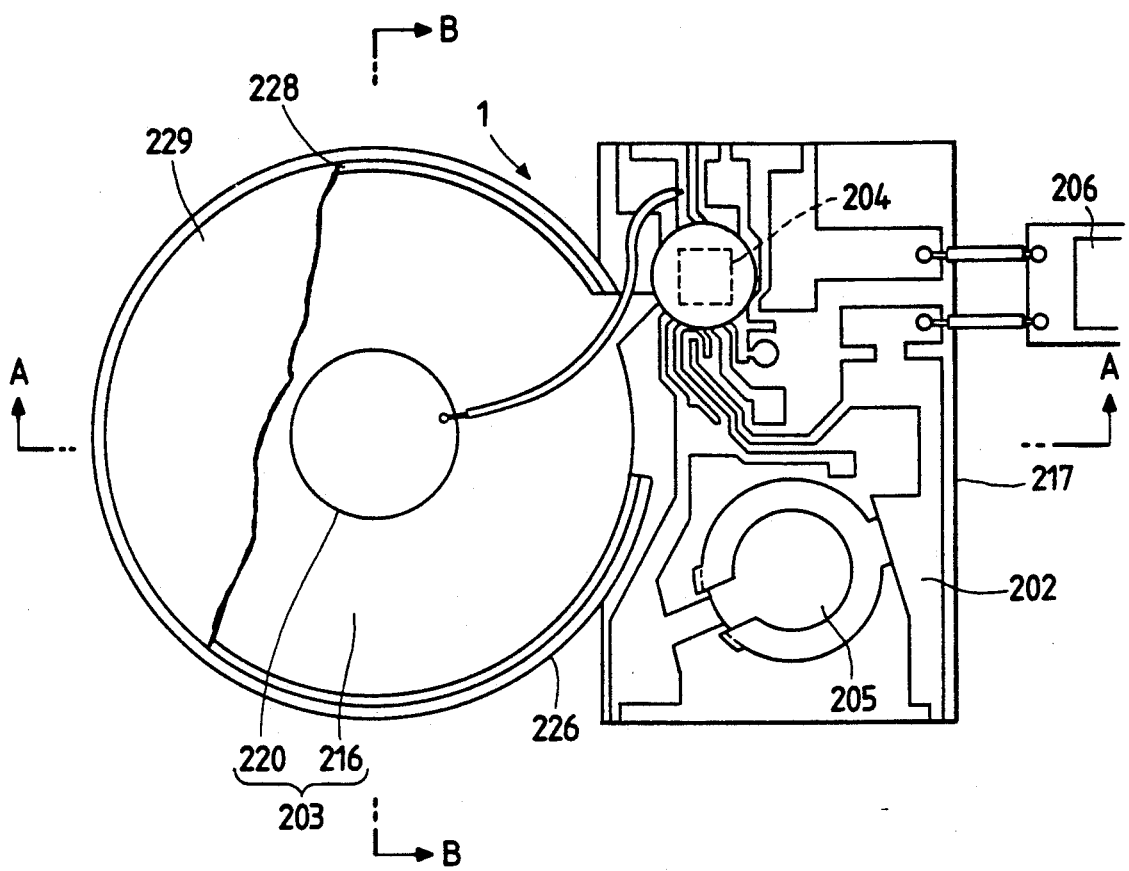
FIG. 15 is a plan view of an electronic sound generating device according to a third embodiment of the present invention.
Figure 16:
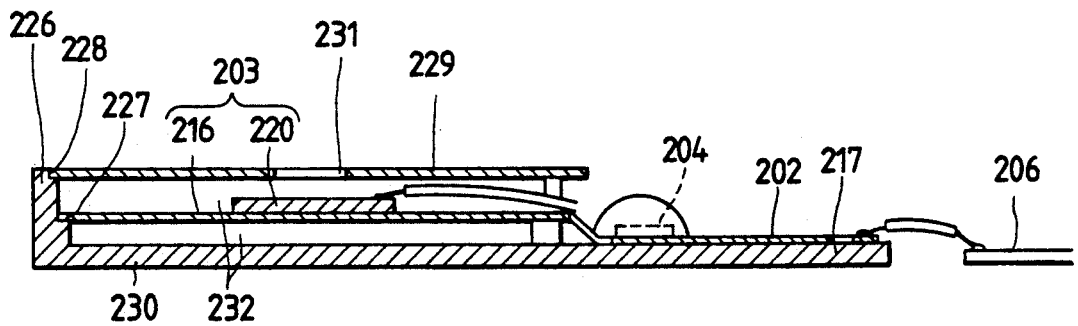
FIGS. 16 and 17 are sectional views of the electronic sound generating device along lines A—A and B—B shown in FIG. 15, respectively.
Figure 17:
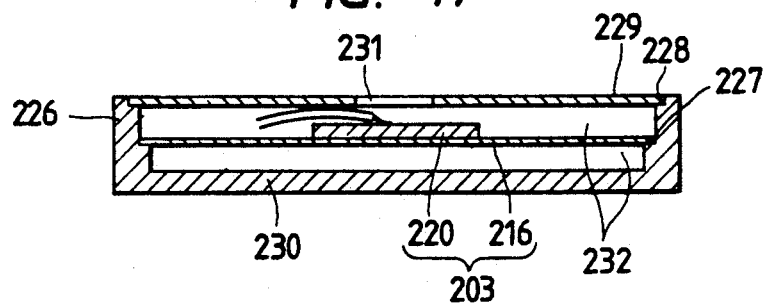

A third preferred embodiment of the present invention is described while referring to FIGS. 15-19. As illustrated in FIG. 15, a electronic sound generating device 201 includes a reinforcing plate 217 for reinforcing a circuit pattern section 202 is integrally formed with a cover 226 whose diameter is substantially equal to the outside diameter of a vibrating plate 216. The cover 226 is disk-shaped and advantageously opens upward. Preferably, cover 226 is slightly larger in diameter than the outside diameter of vibrating plate 216. The inside of the cover 226 includes two steps 227 and 228. The step 227 is located approximately half way between the top edge and the bottom of the cover 226 and supports a sound generator 203. The other step 228 is located at the top of the cover 226 and advantageously is fitted with a plastic cap 229. Preferably, the sound generator 203 is located in the cover 226 so that the bottom of the generator opposes the bottom 230 of the inside of cover 226 and the top of generator 203 opposes cap 229 and is separated by a predetermined distance. It will be apparent that a plurality of acoustic chambers 232 are defined by sound generator 203, cover 226 and cap 229. Preferably, the central portion of the cap 229 includes a sound release hole 231. The sound generator 203 advantageously is secured to both the cover 226 and the reinforcing plate 217.

When the switch 206 of device 201 is turned on and off through external manipulation, an operating instruction is given to the circuit element 204 of the device so that the element sequentially sends out electric signals corresponding to the desired melody while being supplied with power from a battery 205 to drive the electrostrictive member 220 of sound generator 203. When switch 206 is in the ON position, mechanical vibration produced by electrostrictive member 220 is converted into sound by vibrating plate 216. The sound is amplified in a pair of acoustic chambers 232 and emitted through sound release hole 231. The sound of the sound generator 203 is thus amplified by the acoustic chambers 232 prior to being emitted by release hole 231.

Figure 18:
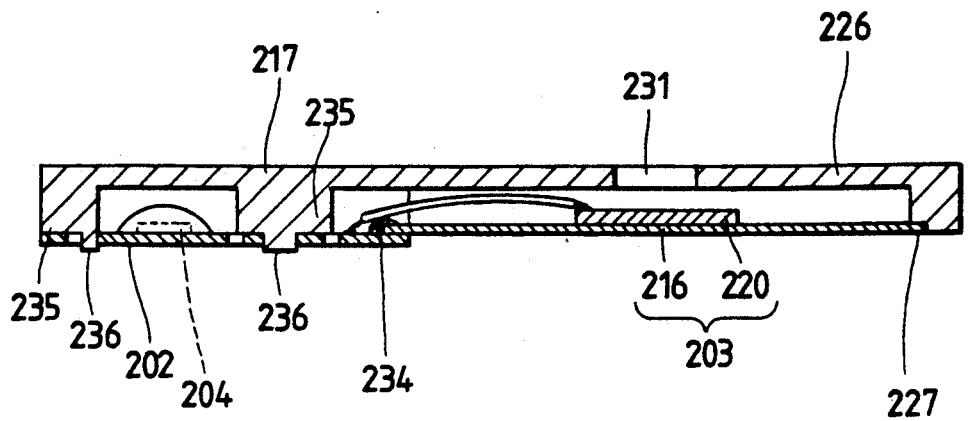
FIGS. 18 and 19 are sectional views of modifications of those of the third embodiment according to the present invention.

A modification of the third preferred embodiment is shown in FIG. 18, in which vibrating plate 216 is directly secured to circuit pattern section 202 by soldering 234. Reinforcing plate 217 advantageously includes a mounting portion 235 for holding the circuit pattern section 202, and a portion comprising cover 226, which also serves as cap 229 and, therefore, has a sound release hole 231 in the central portion of the cover. A sound generator 203 is fitted on the downwardly facing step 227 of the cover 226 so that an acoustic chamber 232 is defined between the vibrating plate 216 and the cover 226. Preferably, the electrostrictive member 220 of sound generator 203 is located in the acoustic chamber 232 and protected by the cover 226 so as not to be exposed directly to the environmnet. The attaching portions 235 of the reinforcing plate 217 advantageously have projections 236 which are fitted in the openings of the circuit pattern section 202 to position reinforcing plate 217. Plate 217 can be secured to section 202 by gluing.

Figure 19:
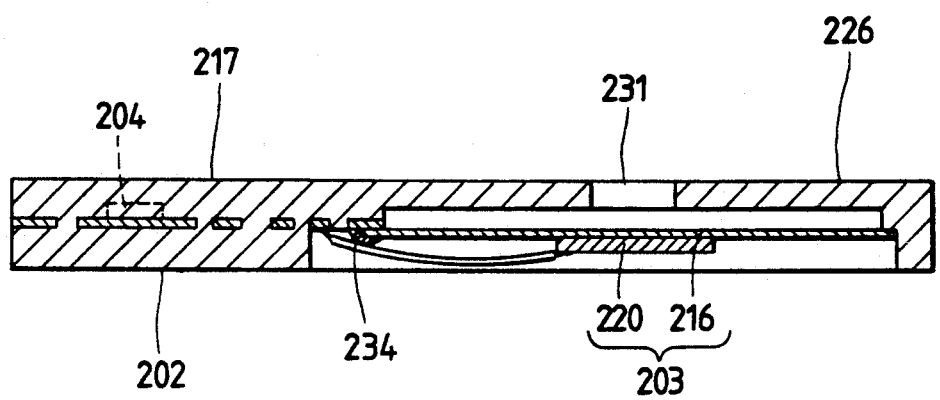

FIG. 19 shows another modification of the third preferred embodiment, in which a coating portion 221, manufactured through potting to protect a circuit element 204, is replaced by a reinforcing plate 217 made of a thermosetting resin by injection molding. Preferably the plate 217 is integrally formed with a cover 226. The resin advantageously surrounds circuit pattern section 202, and an acoustic chamber 232 is defined by the cover 226. A sound generator 203 is fitted in cover 226 after the injection molding.

It will be appreciated that since the circuit pattern section 202, which is made from the thin metal sheet, is reinforced by a reinforcing plate 217, the strength of the completed device 201 will be relatively high. It will also be apparent that, since the reinforcing plate 217 and cover 226 are integrally formed with one another, the number of individual components of the device 201 is diminished. Preferably, the circuit pattern section 202 and the sound generator 203 of device 201 are integrally connected to each other by the reinforcing plate 217, which advantageously improves the efficiency of assembling the device 201. It will also be noted that, since at least one acoustic chamber advantageously is defined by cover 226 and the sound generator 203, the volume of the sound produced by the vibrating plate 216 is amplified and the sound release effect of the device 201 is improved.

According to the present invention, the reinforcing plate 217, cover 226, circuit pattern section 202 and sound generator 203 of the electronic sound generating device are subjected to injection molding so that the individual parts are firmly connected to each other, thus increasing the mechanical strength of device 201. It will be apparent that during, and after, assembly of device 201, and during subsequent installation, the components of device 201 will not separate from one another, thus making the mechanical and electrical strength high enough to maintain electrically stable operation of device 201.

Figure 20:
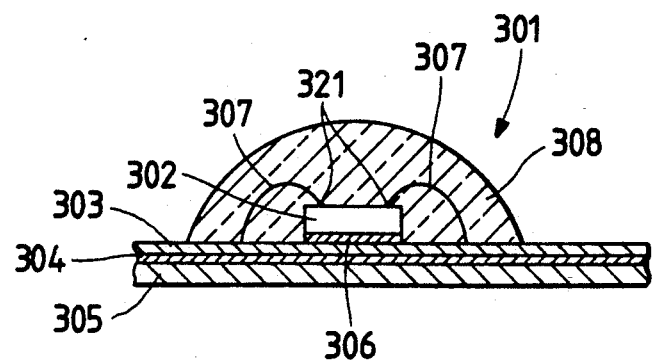
FIG. 20 is a sectional view of the circuit pattern section and circuit element of an electronic sound generating device according to a fourth embodiment of the present invention.
Figure 21:
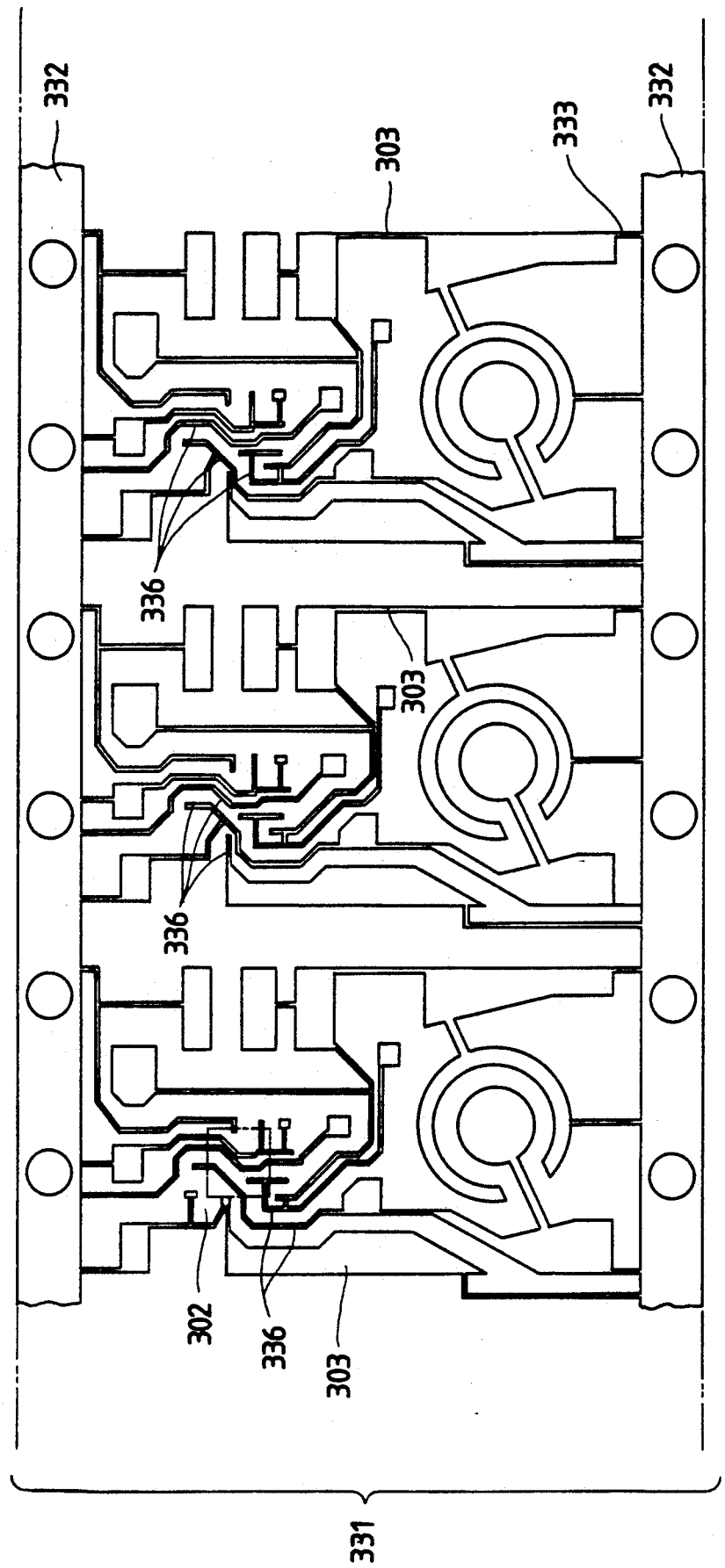
FIG. 21 is a plan view of the circuit pattern section of the electronic sound generating device shown in FIG. 20.

A fourth preferred embodiment of the present invention is described while referring to FIGS. 20, 21 and 22. As shown in FIG. 20, an electronic sound generating device 301 comprises a circuit pattern section 303 on which a circuit element 302 is secured by an adhesive layer 306. A heat-resistant sheet 305 made of a material such as heat-resistant plastic is secured to the bottom of the circuit pattern section 303 by an adhesive layer 304 directly under the circuit element 302. The terminals 321 of the circuit element 302 are electrically coupled to a plurality of terminal portions 336 of the circuit pattern section 303 through electroconductive wires 307. The element 302 and the wires 307 are then coated with a sealing resin 308 to prevent direct exposure of these components to the environment. It will be apparent that, since the circuit pattern section 303 is coated with a sealing resin 308 while the resin is molten, a molding die is not needed for the coating.

A method for manufacturing the circuit pattern section 303 will now be described with reference to FIG. 22a through 22d. Preferably, each circuit pattern section 303 is made from a thin electroconductive metal sheet 331, as shown in FIG. 22a, by punching using a conventional press. Adhesive layers 304 and 306 are than applied to the top and bottom, respectively, of each circuit pattern section 303. The circuit element 302 is positioned on the top of the section 303 and secured thereto by the adhesive layer 304. The heat-resistant sheet 305 of a predetermined size is secured to the bottom of the section 303 by the adhesive layer 306. The resultant structure is shown in FIG. 22b. The electroconductive wires 307 are then connected between the terminals 321 of circuit element 302 and corresponding terminal portions 336 of section 303, as shown in FIG. 22c. The terminal bonding operation of wires 307 to terminals 321 and terminal portions 336 advantageously are provided by a wire bonding machine. Potting of the circuit element 302 and wires 307 is then performed.

As shown in FIG. 22d, sealing resin 308 in the prescribed amount needed for coating the circuit element 302 and the wires 307 is applied to the top of the circuit pattern section 303 by a dispenser (not shown). Preferably, the resin 308 is applied in a liquid or molten state. The resin 308 advantageously flows over and around the circuit element 302 and wires 307 and between the wires 307 and the section 303. The heat-resistant sheet 305, attached by adhesive to section 303, advantageously prevents the resin 308 from flowing out of the openings the section 303. It will be apparent that the size of the sheet 305 is selected to be large enough to prevent the loss of resin 308 through openings in section 303. The heat-resistant sheet 305 advantageously withstands temperatures in excess of those associated with the melting temperature, as well as the temperature of thermosetting or curing, of resin 308. The molten resin 308, which hardens due to either cooling or thermosetting, advantageously coats the circuit element 302 and the electroconductive wires 307 and is integrally connected to the circuit pattern section 303.

Advantageously, adhesive bonding of the circuit element 302 and the heat-resistant sheet 305 to the circuit pattern section 303, the connection of the electroconductive wires 307 to the terminals 321 of the circuit element 302 and the terminal portions 336 of the circuit pattern section 303, and the coating of the circuit element 302 and the wires 307 with resin 308 are sequentially performed while the continuously extending portions 332 of the metal sheet 331 are used as guides to move circuit pattern sections 303. After the fabrication steps shown in FIGS. 22a through 22d, the coupling portions 333 of the metal sheet 331 are cut to separate the continuously extending portions 332 away from circuit pattern sections 303. Thus, each circuit pattern section 303, which is fitted with circuit element 302 and sealed by resin 308, is obtained as a single unit. Other components such as a switch and other electric circuit parts are then mounted in predetermined positions on the circuit pattern section 303.

It will be appreciated that the circuit element 302 and the wires 307 are sealed, not by injection molding, but by utilizing the flowing property of a molten resin. It will be apparent that expensive dies for injection molding are not needed, thus sealing according to the present invention is both simple and inexpensive. It will also be apparent that when the size of the circuit element and the form of the circuit pattern section of the device are changed, only the amount of the sealing resin needs to be altered to seal the circuit element and the wires. It will also be noted that, since a heat-resistant sheet is provided on the bottom of the circuit pattern section, the molten resin applied to seal the element and the wires can not flow out through openings in the circuit pattern section. The resin advantageously enters into the openings of the circuit element, the wires and the circuit pattern section so that the circuit element, the wires and the circuit pattern section are integrally coupled to each other, thus providing nearly the same strength as a conventional molded package.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A device for electronically generating a sound, comprising:

an integrated circuit chip for producing electronic signals;

a switch means for controlling an ON state and OFF state of said integrated circuit chip;

a battery operatively coupled to said integrated circuit chip;

a sound generator having a vibrating plate, said sound generator producing sounds responsive to said electronic signals; and a circuit pattern section having a plurality of lead portions for interconnecting said integrated circuit chip, said switch means, said battery and said sound generator, said circuit pattern section being formed from an electroconductive metal sheet and being fitted with and supporting said integrated circuit chip and said battery wherein said circuit pattern section further comprises a battery holder, and wherein said circuit pattern section and said battery holder are each formed from said electroconductive metal sheet and are formed integrally with one another.

2. The device according to claim 1, wherein said vibrating plate is integrally formed with said circuit pattern section of said electroconductive metal sheet.

3. The device according to claim 1, wherein said circuit pattern section and said switch means are made of said electroconductive metal sheet and are formed integrally with one another.

4. The device according to claim 1, further comprising a reinforcing plate, said reinforcing plate being integrally formed with a cover for said sound generator shaped as a thin plate, said vibrating plate being attached to said circuit pattern section made from said electroconductive metal sheet.

5. The device according to claim 1, wherein said vibrating plate of said sound generator has the shape of a thin plate and has a recess.

6. The device according to claim 1, wherein said circuit pattern section further comprises a plurality of connection portions, and wherein said electronic sound generating device further comprises:
- a plurality of wires electrically coupling said integrated circuit chip to said connection portions;
- a first adhesive layer connecting said integrated circuit chip to a first side of said circuit pattern section;
- a second adhesive layer connecting a heat-resistant sheet to a second side of said circuit pattern section opposite said integrated circuit chip; and
- a resin coating operatively coupled to said first side of said circuit pattern section, said resin coating covering said integrated circuit chip and said wires.

7. An electronic sound generating device for producing a desired melody, comprising:
- a circuit pattern section having a plurality of lead portions, said circuit pattern section being formed from an electroconductive metal sheet;
- an integrated circuit chip operatively coupled to a first set of said lead portions of said circuit pattern section and producing electronic signals corresponding to the desired melody;
- switch means operatively coupled to said integrated circuit chip by a second set of said lead portions for controlling an ON state and an OFF state of said integrated circuit chip;
- a battery operatively coupled to said integrated circuit chip, said battery being operatively positioned on said circuit pattern section by a battery holder means for holding said battery; and
- a sound generator operatively coupled to said circuit pattern section and electrically coupled to said integrated circuit chip, said sound generator having a vibrator means for producing a vibration coupled to a vibrating plate, said sound generator producing sounds responsive to said electronic signals wherein said battery holder means further comprises a third set of lead portions of said circuit pattern section, and wherein said circuit pattern section and said battery holder means are each formed from said electroconductive metal sheet and are formed integrally with one another.

8. The electronic sound generating device according to claim 7, wherein said vibrating plate is a dish-shaped plate and wherein said vibrating plate and an adjacent surface define an acoustic chamber.

9. The electronic sound generating device according to claim 7, wherein said vibrating plate is integrally formed with said circuit pattern section of said electroconductive metal sheet.

10. The electronic sound generating device according to claim 7, wherein a first and a second one of said second set of said lead portions comprise said switch means.

11. The electronic sound generating device according to claim 7, further comprising a reinforcing plate, said reinforcing plate being integrally formed with a cover for said sound generator, said sound generator being attached to said circuit pattern section.

12. The electronic sound generating device according to claim 7, wherein said vibrating plate of said sound generator is shaped as the thin plate having a recess.

13. The electronic sound generating device according to claim 7, wherein said circuit pattern section further comprises a plurality of connection portions, and wherein said electronic sound generating device further comprises:
- a plurality of wires electrically coupling a first side of said integrated circuit chip to said connection portions;
- a first adhesive layer connecting a second side of said integrated circuit chip to a first side of said circuit pattern section;
- a second adhesive layer connecting a heat-resistant sheet to a second side of said circuit pattern section opposite said integrated circuit chip; and
- a resin coating operatively coupled to said first side of said circuit pattern section, said resin coating covering said integrated circuit chip and said wires.

14. In an electronic sound generation device including an integrated circuit chip provide electronic signals corresponding to a desired melody, a switch for controlling the integrated circuit chip, a battery providing power to the integrated circuit chip and a sound generator including a means for vibrating the sound generator responsive to the electronic signals, said electronic sound generating device being formed by a method comprising the steps of:
- punching an electroconductive metal sheet to form a circuit pattern section having a plurality of lead portions;
- punching said electroconductive metal sheet to form a battery holder integrally with said circuit pattern section; and
- connecting the integrated circuit chip, the battery and the sound generator to said circuit pattern section.

15. The method of claim 14, wherein said punching step further comprises punching said electroconductive metal sheet to form a battery holder.

16. The method of claim 14, wherein said punching step further comprises punching said electroconductive metal sheet to form the switch.

17. The method of claim 14, wherein said connecting step further comprises the step a connecting the sound generator to a cover, said sound generator and said cover defining at least one acoustic chamber, and said method further comprising the step of forming a reinforcing plate including said cover.

18. The method according to claim 14, wherein said connecting step further comprises the steps of:
- coating first and second sides of said circuit pattern section with first and second adhesive layers, respectively;
- attaching the integrated circuit chip to said first adhesive layer;
- attaching a heat resistant sheet to said second adhesive layer opposite said integrated circuit chip;
- wiring the integrated circuit chip to a plurality of connection portions of said circuit pattern section with a plurality of corresponding wires; and
- coating the integrated circuit chip and said wires with a resin.

* * * * *